(12) United States Patent
Tanaka et al.

(10) Patent No.: US 9,369,220 B2
(45) Date of Patent: Jun. 14, 2016

(54) RECEIVING DEVICE

(71) Applicant: Panasonic Corporation, Osaka (JP)

(72) Inventors: Koichiro Tanaka, Hyogo (JP); Hiroyuki Motozuka, Kanagawa (JP); Naoya Yosoku, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/824,877

(22) Filed: Aug. 12, 2015

(65) Prior Publication Data

US 2015/0349901 A1 Dec. 3, 2015

Related U.S. Application Data

(63) Continuation of application No. 14/606,695, filed on Jan. 27, 2015, now Pat. No. 9,154,245.

(30) Foreign Application Priority Data

Feb. 5, 2014 (JP) .................................. 2014-020660

(51) Int. Cl.
| | | |
|---|---|---|
| *H04L 27/06* | (2006.01) | |
| *H04B 17/21* | (2015.01) | |
| *H04B 1/10* | (2006.01) | |
| *H03G 3/30* | (2006.01) | |
| *H03G 3/00* | (2006.01) | |
| *H04B 1/16* | (2006.01) | |
| *H04B 17/318* | (2015.01) | |

(52) U.S. Cl.
CPC ............... *H04B 17/21* (2015.01); *H03G 3/005* (2013.01); *H03G 3/3036* (2013.01); *H03G 3/3052* (2013.01); *H03G 3/3078* (2013.01); *H04B 1/1027* (2013.01); *H04B 1/16* (2013.01); *H04B 17/318* (2015.01)

(58) Field of Classification Search
CPC ........ H04B 1/1027; H04B 17/21; H04B 1/16; H03G 3/3036; H03G 3/005; H03G 3/3042
USPC .......................................................... 375/342
See application file for complete search history.

(56) References Cited

U.S. PATENT DOCUMENTS

| | | | |
|---|---|---|---|
| 4,455,681 | A | 6/1984 | Wile |
| 4,870,370 | A | 9/1989 | Hedberg et al. |
| 5,507,023 | A | 4/1996 | Suganuma et al. |
| 6,226,504 | B1 | 5/2001 | Takagi |

(Continued)

FOREIGN PATENT DOCUMENTS

| | | |
|---|---|---|
| JP | 2005-278017 | 10/2005 |
| JP | 2006-086665 | 3/2006 |
| JP | 2011-182389 | 9/2011 |

*Primary Examiner* — Juan A Torres
(74) *Attorney, Agent, or Firm* — Seed IP Law Group PLLC

(57) ABSTRACT

A receiving device that receives a signal in a receiving antenna. The receiving device includes a gain controller that adjusts a gain in the receiving device in response to information related to power of the signal, and a signal detector that determines whether, within a predetermined period after the information related to the power of the signal exceeds a first threshold value, the information related to the power of the signal exceeds a second threshold value which is larger than the first threshold value. The gain controller adjusts a search range of the gain in the receiving device based on a determination result of the signal detector with respect to the information related to the power of the signal.

10 Claims, 12 Drawing Sheets

(56) References Cited

U.S. PATENT DOCUMENTS

| | | |
|---|---|---|
| 7,689,217 B2 | 3/2010 | Ruelke et al. |
| 2005/0032496 A1 | 2/2005 | Saeki |
| 2006/0058035 A1 | 3/2006 | Tsuruno |
| 2007/0066259 A1 | 3/2007 | Ryan et al. |
| 2007/0076783 A1 | 4/2007 | Dishman et al. |
| 2008/0070534 A1 | 3/2008 | Lai |
| 2010/0118917 A1 | 5/2010 | Oh et al. |
| 2012/0195384 A1 | 8/2012 | Sato |

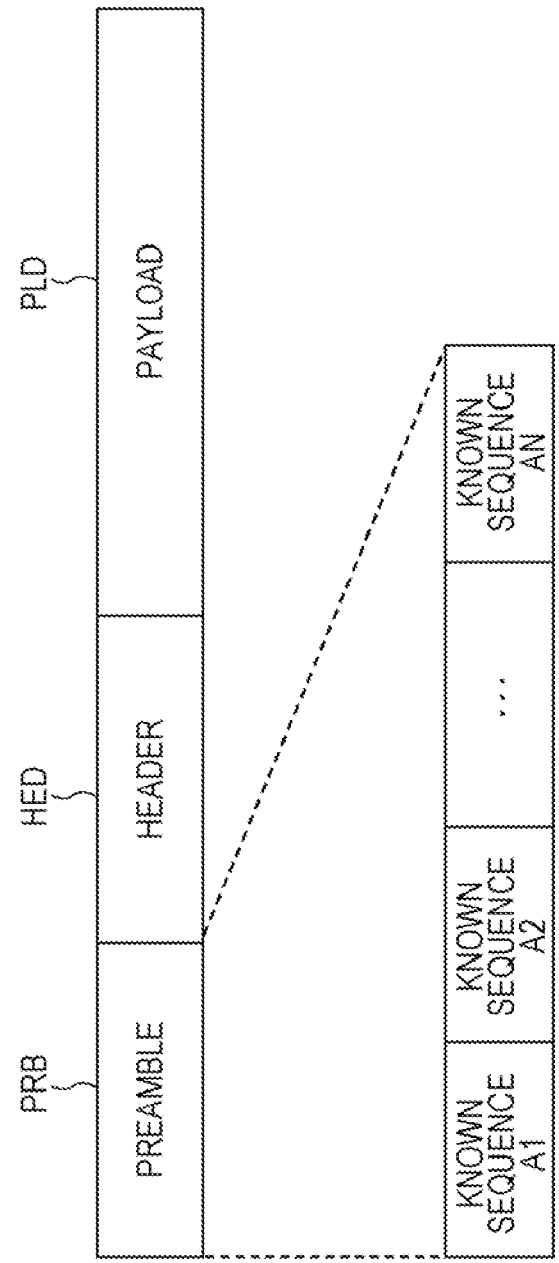

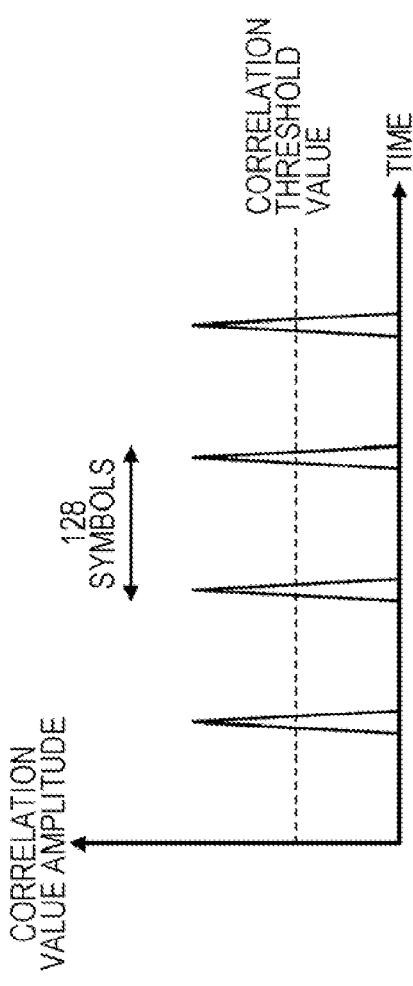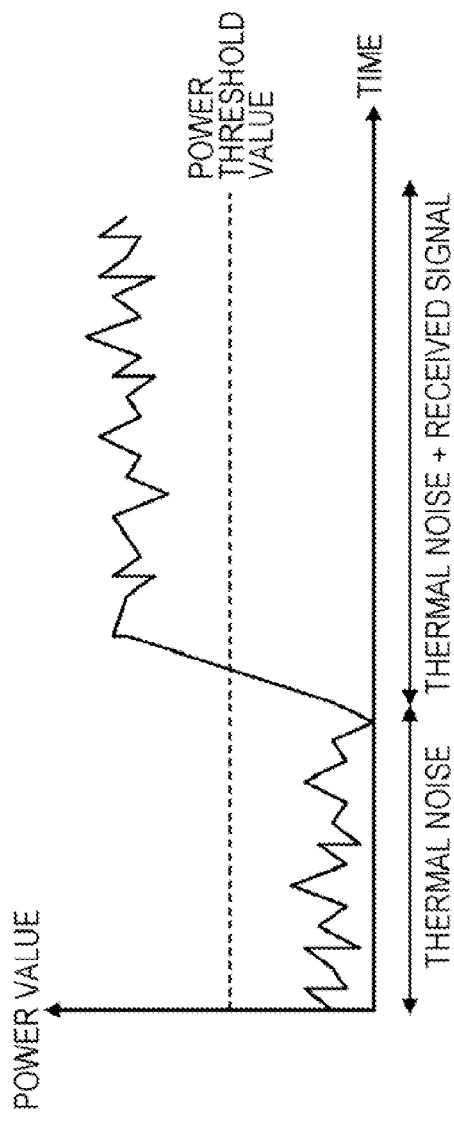

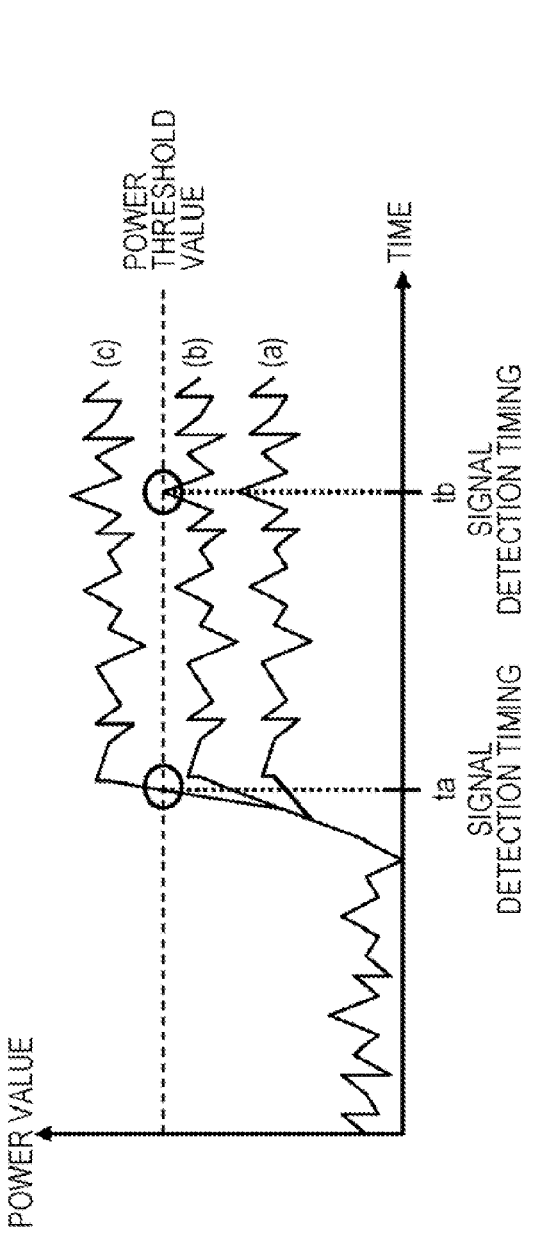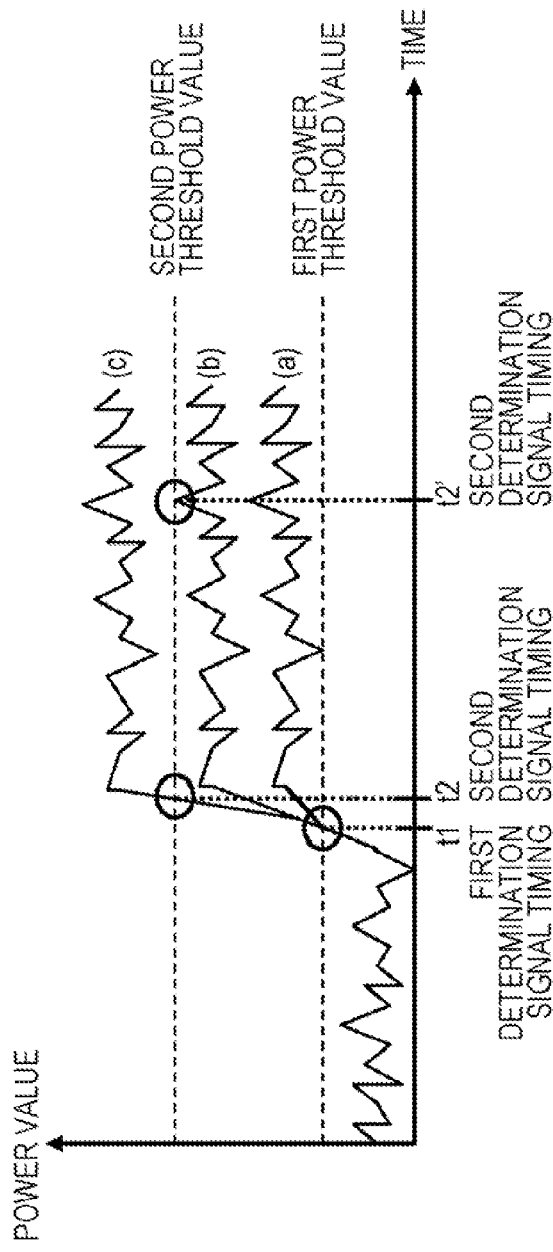

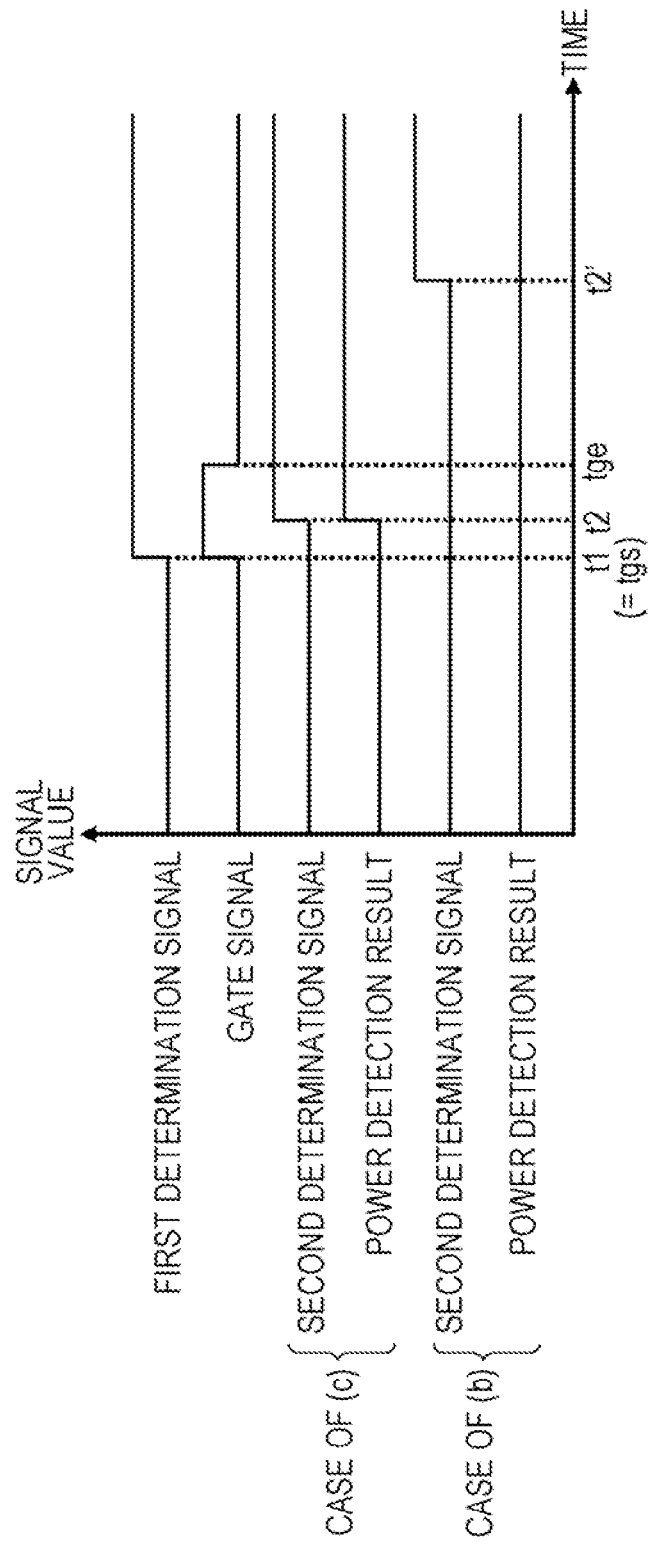

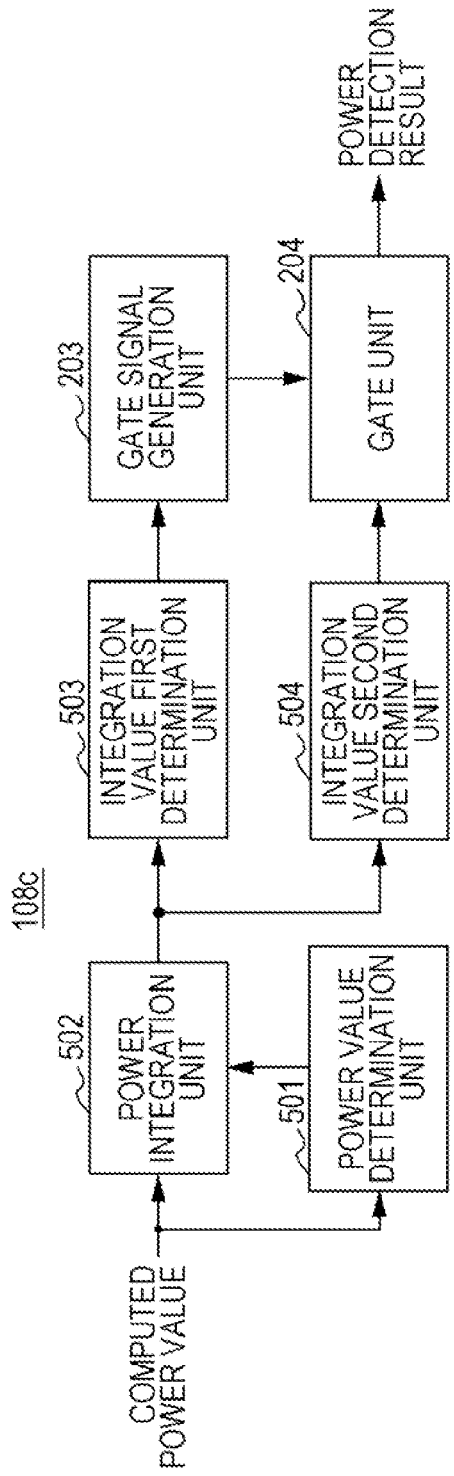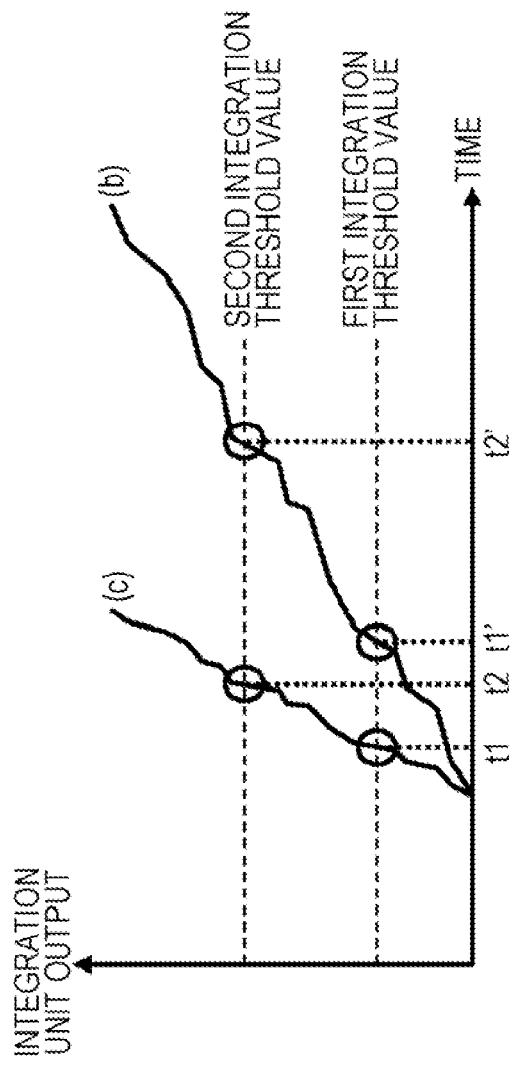

RECEIVING DEVICE

CROSS REFERENCES TO RELATED APPLICATIONS

This application is a Continuation of U.S. application Ser. No. 14/606,695, filed on Jan. 27, 2015 which claims priority to Japanese Patent Application No. 2014-020660, filed on Feb. 5, 2014, the contents of which are hereby incorporated by reference.

BACKGROUND

1. Technical Field

The present disclosure relates to a receiving device that controls a gain in response to power of a received signal.

2. Description of the Related Art

For wireless local area networks (LANs), the standardization of, for example, the Institute of Electrical and Electronics Engineering, Inc. (IEEE) 802.11ad communication specifications has been promoted. In IEEE 802.11ad, an access control method referred to as carrier sense multiple access/collision avoidance (CSMA/CA) has been adopted.

In CSMA/CA, a receiving device detects a signal existing in a wireless transmission path, and adjusts a gain for amplifying the detected signal such that a fluctuation range of the detected signal falls within a dynamic range of an analog-digital converter (ADC). In IEEE 802.11ad, a training sequence referred to as a preamble is given to the head of a packet, and the receiving device performs automatic gain control (AGC) using the preamble.

As a technique by which AGC converges at a high speed in a limited preamble section, a technique in, for example, Japanese Unexamined Patent Application Publication No. 2005-278017 is known. A wireless communication device described in Japanese Unexamined Patent Application Publication No. 2005-278017 stores an optimum gain value for AGC in past communication, and sets the stored gain value as a standby gain value for each AGC circuit during a standby period, thereby reducing the convergence time before an optimum gain value is decided when communication is resumed.

SUMMARY

In Japanese Unexamined Patent Application Publication No. 2005-278017, when the wireless communication device communicates with a terminal located close to the wireless communication device (referred to as a "terminal A" for convenience) and a terminal located distant from the wireless communication device (referred to as a "terminal B" for convenience), a gain value for AGC in the communication with the terminal A converges on a small gain value because the distance is short.

However, when the gain value for AGC that has converged in the communication with the terminal A is set as a standby gain value, the standby gain in the wireless communication device is small. Therefore, there is a problem in that it takes time for AGC to converge for a signal arriving from the distant terminal B, signal demodulation is delayed, and the signal detection accuracy is degraded. In addition, when the terminal A is moved, the standby gain in the wireless communication device becomes unsuitable. Therefore, there is also a problem in that it takes time for AGC to converge, signal demodulation is delayed, and the signal detection accuracy is degraded.

One non-limiting and exemplary embodiment provides a receiving device that enhances the speed of convergence of AGC processing and suppresses degradation of the detection accuracy for a received signal, regardless of whether a device with which the receiving device communicates is changed or moved.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a receiving device that receives a signal in a receiving antenna. The receiving device includes a gain controller that adjusts a gain in the receiving device in response to information related to power of the signal, and a signal detector that determines whether, within a predetermined period after the information related to the power of the signal exceeds a first threshold value, the information related to the power of the signal exceeds a second threshold value which is larger than the first threshold value. The gain controller adjusts a search range of the gain in the receiving device based on a determination result of the signal detector with respect to the information related to the power of the signal.

A receiving device according to the present disclosure can enhance the speed of convergence of AGC processing and suppress degradation of the detection accuracy for a received signal, regardless of whether a device with which the receiving device communicates is changed or moved.

These general and specific aspects may be implemented using a system, a method, and a computer program, and any combination of systems, methods, and computer programs.

BRIEF DESCRIPTION OF THE DRAWINGS

FIG. 3 schematically illustrates a structure of a packet received by the receiving device of the present embodiment and a structure of a preamble added to the head of the packet;

FIG. 4A illustrates correlation detection, and FIG. 4B illustrates power detection;

FIG. 6A illustrates power detection timings when signal reception intensities are weak, medium, and strong, and FIG. 6B illustrates output timings of a first determination signal and a second determination signal when signal reception intensities are weak, medium, and strong;

FIG. 7 illustrates a first determination signal, a gate signal, and a second determination signal when signal reception intensities are strong and medium;

FIG. 12A is a block diagram illustrating in detail an internal configuration of a power detection unit of a third variation, and FIG. 12B illustrates an example of a relationship of integration unit outputs when signal reception intensities are strong and medium.

DETAILED DESCRIPTION

An embodiment of a receiving device according to the present disclosure (referred to below as the "present embodiment") will now be described with reference to the drawings. The receiving device of the present embodiment is an information communication terminal that complies with wireless LAN communication specifications (for example, IEEE 802.11ad), and is, for example, a smartphone or tablet terminal. However, the receiving device of the present embodiment is not limited to a smartphone or tablet terminal.

Figure 1:
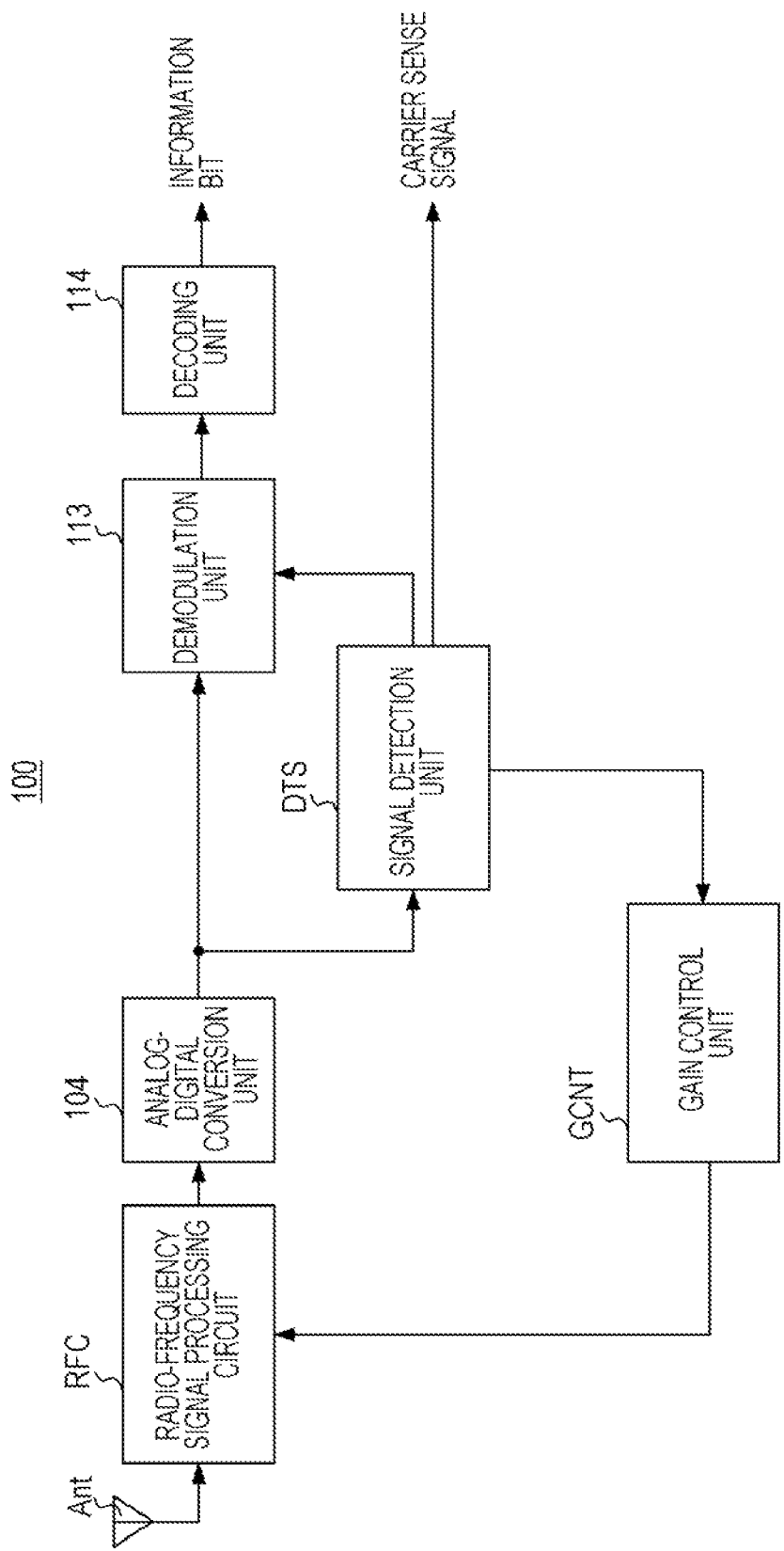
FIG. 1 is a block diagram schematically illustrating an internal configuration of a receiving device of a present embodiment.
Figure 2:
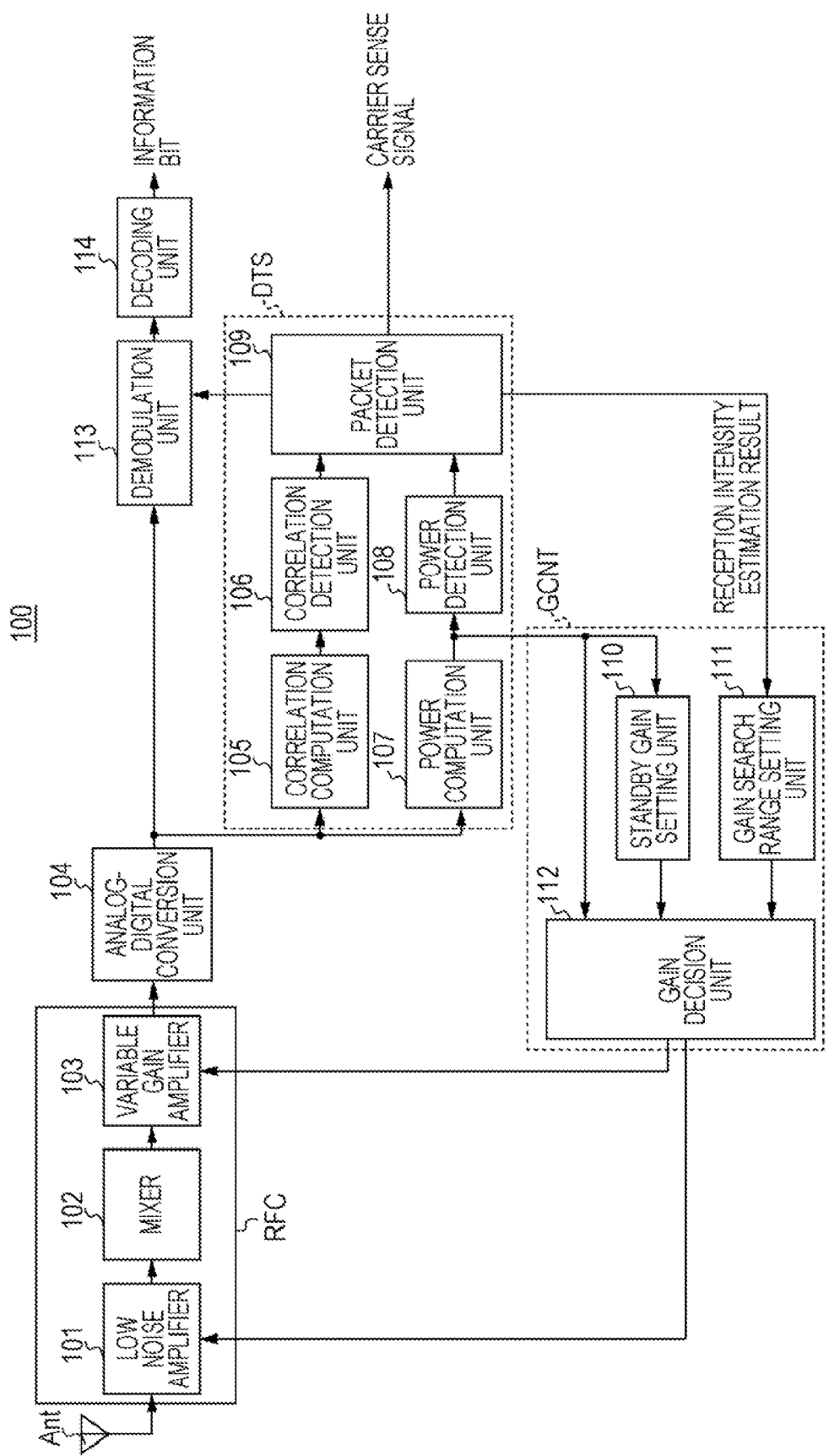
FIG. 2 is a block diagram illustrating in detail the internal configuration of the receiving device of the present embodiment.

FIG. 1 is a block diagram schematically illustrating an internal configuration of a receiving device 100 of the present embodiment. FIG. 2 is a block diagram illustrating in detail the internal configuration of the receiving device 100 of the present embodiment. The receiving device 100 illustrated in FIG. 1 includes a radio-frequency signal processing circuit RFC to which a receiving antenna Ant is connected, an analog-digital conversion unit 104, a signal detection unit DTS, a gain control unit GCNT, a demodulation unit 113, and a decoding unit 114.

The radio-frequency signal processing circuit RFC includes a low noise amplifier (LNA) 101, a mixer (MIX) 102, and a variable gain amplifier (VGA) 103. The signal detection unit DTS includes a correlation computation unit 105, a correlation detection unit 106, a power computation unit 107, a power detection unit 108, and a packet detection unit 109. The gain control unit GCNT includes a standby gain setting unit 110, a gain search range setting unit 111, and a gain decision unit 112. That is, the receiving device 100 uses the signal detection unit DTS to determine a state of a received signal using information related to power of the input signal, and uses the gain control unit GCNT to decide a gain search range based on the determined state of the received signal. Information related to power of a signal may be an absolute value of an amplitude of the signal, the power, the number of times the predetermined power has occurred, or an integration value of the power.

The operation of the units of the receiving device 100 illustrated in FIG. 1 or FIG. 2 will now be described.

The receiving antenna Ant receives a radio-frequency signal (for example, a millimeter-wave) transmitted from the outside, which is a device with which the receiving device 100 communicates (for example, a transmitting device, not illustrated). The radio-frequency signal received in the receiving antenna Ant is input to the radio-frequency signal processing circuit RFC.

The radio-frequency signal processing circuit RFC amplifies the radio-frequency signal received in the receiving antenna Ant using a gain decided by the gain control unit GCNT. The radio-frequency signal processing circuit RFC converts the radio-frequency signal received in the receiving antenna Ant to a baseband signal using a local oscillation signal in the receiving device 100 (local signal, not illustrated). The baseband signal is input to the analog-digital conversion unit 104.

The low noise amplifier 101 amplifies the radio-frequency signal received in the receiving antenna Ant using a gain for the low noise amplifier 101 decided by the gain decision unit 112, and outputs the signal to the mixer 102.

The mixer 102 down-converts the frequency of the radio-frequency signal amplified by the low noise amplifier 101 and converts the radio-frequency signal to a baseband signal using a local oscillation signal in the receiving device 100 (local signal, not illustrated), and outputs the signal to the variable gain amplifier 103.

The variable gain amplifier 103 amplifies the baseband signal output from the mixer 102 using a gain for the variable gain amplifier 103 decided by the gain decision unit 112, and outputs the signal to the analog-digital conversion unit 104.

The analog-digital conversion unit 104 samples and quantizes the analog baseband signal amplified by the variable gain amplifier 103 to perform analog-digital (AD) conversion to a digital baseband signal, and outputs the signal to the correlation computation unit 105, the power computation unit 107, and the demodulation unit 113.

After the standby gain setting unit 110, which will be described later, sets a standby gain, the receiving device 100 enters a received signal standby status. When the receiving device 100 stands by for a signal, the product (the sum in decibels) of a gain for the low noise amplifier 101 and a gain for the variable gain amplifier 103 is defined as a "standby gain".

In a received signal standby status, the signal detection unit DTS determines whether a signal is detected, based on a power computation value and a cross-correlation value (see the later description) of the signal quantized by the analog-digital conversion unit 104 (referred to below as a "quantized signal"). When it is determined that a signal is detected, the signal detection unit DTS outputs a carrier sense signal that provides notification of the signal detection.

As described below, the correlation computation unit 105 performs correlation computation of a quantized signal and a known sequence retained in advance (see the later description) to calculate a cross-correlation value. The correlation detection unit 106 detects the signal using the cross-correlation value. In the present disclosure, a signal detection method by which whether there is a signal is determined using the correlation computation unit 105 and the correlation detection unit 106 is defined as "correlation detection".

Moreover, the power computation unit 107 outputs a power computation value of a signal. The power detection unit 108 detects the signal using the power computation value. In the present disclosure, a signal detection method by which whether there is a signal is determined using the power computation unit 107 and the power detection unit 108 is defined as "power detection".

Specifically, the packet detection unit 109 uses a cross-correlation value computed by the correlation computation unit 105 as a first criterion for determining signal detection, and uses a signal power computation value computed by the power computation unit 107 as a second criterion for determining signal detection. The packet detection unit 109 determines whether a signal (packet) is detected, using a power detection result based on the signal power computation value and a correlation detection result based on the cross-correlation value.

That is, the packet detection unit 109 estimates that a signal reception intensity is strong or not strong in accordance with the signal detection methods listed in Table 1 (that is, whether a signal is detected through power detection or through correlation detection), and outputs a reception intensity estimation result to the gain search range setting unit 111. Table 1 lists a correspondence relationship between the signal detection methods and signal reception intensities.

TABLE 1

| Signal detection method | Signal reception intensity |
|---|---|
| Power detection | Strong |
| Correlation detection | Not strong (=medium or weak) | n it is determined that a signal is detected, the packet detection unit 109 outputs a carrier sense signal that provides notification of the signal detection. In addition, when it is determined that the detected signal is a signal from a local system (see the later description), the packet detection unit 109 outputs a control signal for demodulating the detected signal to the demodulation unit 113.

The correlation computation unit 105 computes a cross-correlation value of a quantized signal and a known sequence retained in advance by the correlation computation unit 105, and outputs the cross-correlation value to the correlation detection unit 106. The known sequence is, for example in IEEE 802.11ad, a Golay sequence that constitutes a preamble PRB added to the head of a packet as illustrated in FIG. 3, but not limited to a Golay sequence. FIG. 3 schematically illustrates a structure of the packet received by the receiving device 100 of the present embodiment and a structure of the preamble PRB added to the head of the packet.

A transmitting device (not illustrated), which is a device with which the receiving device 100 communicates, transmits a packet with the preamble PRB added to the head. The preamble PRB is configured to combine a plurality of known sequences A1, A2 to AN. Each of the N sequences A1, A2 to AN may be identical or may have a reversed sign. Each of A1, A2 to AN can be represented as A or −A using a single known sequence A.

That is, the correlation computation unit 105 retains the known sequence A that becomes a basis for a plurality of known sequences A1 to AN, and computes a cross-correlation value of the plurality of known sequences A1 to AN in the preamble PRB added to the head of a quantized signal (received signal) and the known sequence A retained in advance (see FIG. 4A). FIG. 4A illustrates correlation detection.

The correlation detection unit 106 makes a comparison between the cross-correlation value computed by the correlation computation unit 105 and a predetermined correlation threshold value illustrated in FIG. 4A, and determines whether a peak value of the cross-correlation value computed by the correlation computation unit 105 exceeds the correlation threshold value illustrated in FIG. 4A. The correlation detection unit 106 outputs, to the packet detection unit 109, a result of determining whether the peak value of the cross-correlation value computed by the correlation computation unit 105 exceeds the correlation threshold value illustrated in FIG. 4A.

By appropriately adjusting the correlation threshold value, the peak value of the cross-correlation value computed by the correlation computation unit 105 exceeds the correlation threshold value illustrated in FIG. 4A, when a signal from a local system (see the later description) is received by the receiving device 100. However, the peak value of the cross-correlation value does not exceed the correlation threshold value illustrated in FIG. 4A, when an interference signal from another system is received by the receiving device 100.

Accordingly, the packet detection unit 109 can determine whether a quantized signal is a received signal from a local system or an interference signal from another system through correlation detection in the correlation computation unit 105 and the correlation detection unit 106.

Further, the correlation computation unit 105 can improve an SNR of a peak value of a cross-correlation value by using, as a known sequence, one with high characteristics for suppressing cross-correlation value side lobe. For example, a Golay sequence used in IEEE 802.11ad has high characteristics for suppressing cross-correlation value side lobe.

With a sequence that can ideally suppress side lobe, an SNR of a peak value of a cross-correlation value is multiplied by a sequence length of an SNR of a quantized signal (received signal). For example, when a sequence length is 128 symbols, an SNR is multiplied by 128. Even though an SNR of a quantized signal (received signal) is small, that is, the reception intensity of the signal received by the receiving device 100 is weak, an SNR of a peak value of a cross-correlation value is large, and therefore the detection accuracy using the cross-correlation value is high.

On the other hand, until at least the entire known sequence A1 is received by the receiving device 100, a peak value of the cross-correlation value computed by the correlation computation unit 105 does not occur. In FIG. 4A, for example, when a sequence length of a known sequence is 128 symbols, a peak value of a cross-correlation value occurs 128 symbols after the start of reception of a quantized signal. That is, waiting time is required for a determination of signal detection using correlation detection.

After a standby gain is set, the power computation unit 107 squares, for example, an amplitude of a signal to average samples in a certain period of time (for example, 16 samples), and thereby computes the power of the signal and then outputs the power value to the power detection unit 108, the standby gain setting unit 110, and the gain decision unit 112. FIG. 4B illustrates power detection.

In the present embodiment, the packet detection unit 109 determines that the signal is detected, based on a power detection result from the power detection unit 108 with respect to the signal power value computed by the power computation unit 107. Moreover, the packet detection unit 109 may determine that the signal is detected when the signal power value computed by the power computation unit 107 exceeds a predetermined power threshold value (see FIG. 4B).

The packet detection unit 109 can detect a signal transmitted from a local system (for example, a transmitting device that complies with the same communication specifications (IEEE 802.11ad) as those in the receiving device 100; the same applies below), through power detection using a signal power value, and can also detect an interference signal transmitted from another system (for example, a transmitting device that complies with different communication specifications from those in the receiving device 100; the same applies below).

In FIG. 4B, at the timing at which the receiving device 100 receives a signal, a total power value of the signal and thermal noise rises in a relatively short amount of time with respect to a time length of the received signal. Therefore, the instantaneousness of signal detection is high, that is, the time required for signal detection is short. For example, when a power value of a signal is sufficiently large with respect to a power value of thermal noise, and a reception signal-to-noise ratio (SNR), which indicates the strength of a reception intensity of a signal received from a device with which the receiving device 100 communicates, is high, a total power value of the signal and thermal noise rises quickly. However, as the SNR becomes lower, a signal detection timing becomes slower because a signal power value is distorted due to external noise and rises slowly.

The power detection unit 108 determines whether the reception intensity of the signal received from a transmitting device, which is a device with which the receiving device 100 communicates, is strong, based on the signal power value computed by the power computation unit 107. Then, the power detection unit 108 outputs a result of determining whether the signal reception intensity is strong (referred to below as a "power detection result") to the packet detection unit 109. The detailed operation of the power detection unit 108 will be described later with reference to FIGS. 5 to 8.

In a received signal standby status, the gain control unit GCNT monitors the power of the thermal noise quantized by the analog-digital conversion unit 104. The gain control unit GCNT adjusts a gain search range for AGC processing appropriate to the power value of the received signal detected by the packet detection unit 109, using a reception intensity estimation result (see the later description) output from the packet detection unit 109.

After the packet detection unit 109 determines that the signal is detected, the gain control unit GCNT controls each of gains for the low noise amplifier 101 and the variable gain amplifier 103 such that a fluctuation range of the level of the detected signal falls within a dynamic range of the analog-digital conversion unit 104.

In a received signal standby status, the standby gain setting unit 110 monitors the power value of the thermal noise quantized by the analog-digital conversion unit 104. The standby gain setting unit 110 decides each of gains for the low noise amplifier 101 and the variable gain amplifier 103 such that the power value of the quantized thermal noise is equal to a predetermined standby power target value.

The standby power target value is, for example, a predetermined percentage of a power value for maximizing an output amplitude of the analog-digital conversion unit 104 (for example, 30%). The product (the sum in decibels) of a gain for the low noise amplifier 101 and a gain for the variable gain amplifier 103 in a standby status is referred to below as a "standby gain Gs".

The standby gain setting unit 110 adjusts the standby gain to be a large value such that the power value of the thermal noise quantized by the analog-digital conversion unit 104 is equal to the standby power target value. Accordingly, even though the power value of the signal quantized by the analog-digital conversion unit 104 is small, the receiving device 100 can adjust the power value of the signal amplified by the low noise amplifier 101 and the variable gain amplifier 103 so that the power value of the signal is equal to or larger than the quantization resolution of the analog-digital conversion unit 104.

In accordance with Table 2, the gain search range setting unit 111 adjusts and sets a gain search range for AGC processing appropriate to the power value of the received signal detected by the packet detection unit 109, using a reception intensity estimation result output from the packet detection unit 109. The gain search range for AGC processing is a gain search range for each of gains for the low noise amplifier 101 and the variable gain amplifier 103. Table 2 lists an example of a relationship between the signal reception intensities and gain search ranges. The specific operation of the gain search range setting unit 111 of the gain control unit GCNT will be described later with reference to FIG. 9.

TABLE 2

| Signal reception intensity | Gain search range |
|---|---|
| Strong | Widened |
| Not strong | Narrowed |

In the gain search range set by the gain search range setting unit 111, the gain decision unit 112 performs AGC processing using the standby gain set by the standby gain setting unit 110 and the received signal power value computed by the power computation unit 107.

That is, in the gain search range set by the gain search range setting unit 111, the gain decision unit 112 decides each of gains for the low noise amplifier 101 and the variable gain amplifier 103 such that the power value of the received signal detected by the packet detection unit 109 is equal to a predetermined reception power target value. The product (the sum in decibels) of a gain for the low noise amplifier 101 and a gain for the variable gain amplifier 103 is referred to below as a "total gain".

After deciding each of the gains for the low noise amplifier 101 and the variable gain amplifier 103, the gain decision unit 112 sets the gain for the low noise amplifier 101 in the low noise amplifier 101 and also sets the gain for the variable gain amplifier 103 in the variable gain amplifier 103. The reception power target value is, for example, a predetermined percentage of a power value for maximizing an output amplitude of the analog-digital conversion unit 104 (for example, 60%). The reception power target value is higher than the standby power target value.

When the power value of the received signal quantized by the analog-digital conversion unit 104 is smaller than the reception power target value, the gain decision unit 112 makes the total gain larger. When the power value of the received signal is larger than the reception power target value, the gain decision unit 112 makes the total gain smaller. When the power value of the received signal does not reach the reception power target value within the prescribed time for AGC processing, it is assumed that a timeout has occurred in the AGC processing, and the gain decision unit 112 forces termination of the AGC processing.

The demodulation unit 113 starts demodulation of the received signal quantized by the analog-digital conversion unit 104 in response to a control signal output from the packet detection unit 109, and outputs a demodulation result to the decoding unit 114. After the AGC processing in the signal detection unit DTS and the gain control unit GCNT converges, the demodulation unit 113 demodulates a header HED region and a payload PLD region illustrated in FIG. 3 in this order.

The decoding unit 114 performs predetermined error correction decoding processing for the demodulation result from the demodulation unit 113, reconstructs information bits transmitted from the transmitting device, and outputs the information bits to the subsequent stage. In the packet transmitted from the transmitting device, predetermined error correction codes are added to the header HED and the payload PLD. The header HED is a field that stores control information required for demodulation of the payload PLD. The payload PLD is information data other than the control information stored in the preamble PRB and the header HED, and is, for example, image data.

(Detailed Configuration and Operation of the Power Detection Unit 108 of the Receiving Device 100)

Figure 5:
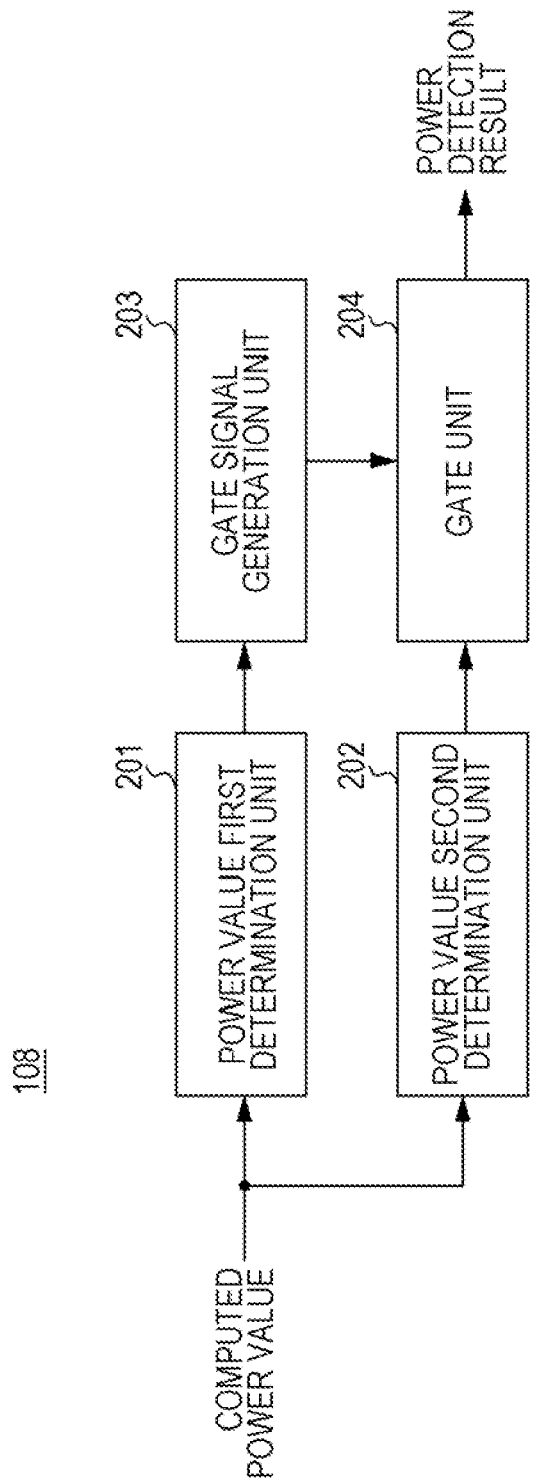
FIG. 5 is a block diagram illustrating in detail an example of an internal configuration of a power detection unit of the present embodiment.

The detailed configuration and operation of the power detection unit 108 of the receiving device 100 of the present embodiment will next be described with reference to FIGS. 5 to 8. FIG. 5 is a block diagram illustrating in detail an example of an internal configuration of the power detection unit 108 of the present embodiment. FIG. 6A illustrates power detection timings when signal reception intensities are weak, medium, and strong. FIG. 6B illustrates output timings of a first determination signal and a second determination signal when signal reception intensities are weak, medium, and strong. FIG. 7 illustrates a first determination signal, a gate signal, and a second determination signal when signal reception intensities are strong and medium.

In FIG. 6A, for (a) which indicates a power value when a signal reception intensity is weak, the power value does not exceed a predetermined power threshold value, and therefore signal detection through power detection is not determined. However, because signal detection through correlation detection is determined, reception is possible.

For (c) which indicates a power value when a signal reception intensity is strong, the power value exceeds the predetermined power threshold value after the computation of the power value by the power computation unit 107 (time point ta), and therefore a gain search range is set widely. However, because the time required before signal detection is short (time point ta), reception is possible even though the convergence time of AGC processing is long. The time point ta is a timing of signal detection through power detection when a signal reception intensity is strong.

However, for (b) which indicates a power value when a signal reception intensity is medium, the power value transitions near the predetermined power threshold value due to, for example, an influence of external noise, and has uncertainty about whether or not the power value exceeds the power threshold value, thereby causing the time required before signal detection to be long (time point tb). The time point tb is a timing of signal detection through power detection when a signal reception intensity is medium. Therefore, when a signal reception intensity is medium, the time required for power detection may be long, and may be nearly equal to the time required for correlation detection.

Accordingly, for (b) which indicates a power value when a signal reception intensity is medium, it is determined that a signal is detected through power detection at the time point tb, and a wide gain search range is set. Therefore, the convergence time of the AGC processing in the gain decision unit 112 is long. When both the time required before power detection and the time required before convergence of AGC processing are long, the start of demodulation in the demodulation unit 113 is delayed and there is a higher probability that an error occurs in the information bits reconstructed by the decoding unit 114.

In the present embodiment, the signal detection unit DTS uses a method by which when an SNR of a received signal, that is, the reception intensity of the signal transmitted from a device with which the receiving device 100 communicates is medium, the signal is detected through correlation detection, and further, when the SNR (signal reception intensity) of the received signal is strong, power detection is performed.

Therefore, when the reception intensity of the signal transmitted from the device with which the receiving device 100 communicates is medium, the signal detection unit DTS detects the signal through correlation detection and the gain search range setting unit 111 narrows a gain search range for AGC processing. Accordingly, the time required before convergence of the AGC processing in the gain decision unit 112 is short, and therefore the receiving device 100 can suppress a delay in the start of demodulation in the demodulation unit 113 and suppress occurrence of a reception error.

The specific configuration and operation of the power detection unit 108 illustrated in FIG. 5 will next be described. The power detection unit 108 illustrated in FIG. 5 has a power value first determination unit 201, a power value second determination unit 202, a gate signal generation unit 203, and a gate unit 204.

The power value first determination unit 201 makes a comparison between the power value of the signal computed by the power computation unit 107 (referred to below as a "computed power value") and a predetermined first power threshold value. When the computed power value of the signal exceeds the first power threshold value, the power value first determination unit 201 outputs a first determination signal to the gate signal generation unit 203. The first power threshold value is a predetermined percentage of a signal power value for maximizing an output amplitude of the analog-digital conversion unit 104, and this percentage exceeds the standby power target value (for example, 50%).

The power value second determination unit 202 makes a comparison between the computed power value of the signal computed by the power computation unit 107 and a predetermined second power threshold value. When the computed power value of the signal exceeds the second power threshold value, the power value second determination unit 202 outputs a second determination signal to the gate signal generation unit 203. The second power threshold value is a predetermined percentage of a signal power value for maximizing an output amplitude of the analog-digital conversion unit 104, and this percentage exceeds the standby power target value (for example, 70%).

The gate signal generation unit 203 generates a gate signal for a predetermined gate period after the input of the first determination signal (for example, from a time point tgs to a time point tge illustrated in FIG. 7). The predetermined gate period is set to be shorter than a delay time allowed for power detection such that the start of signal demodulation in the demodulation unit 113 is not delayed.

For example, when signal detection through correlation detection requires the time corresponding to one known sequence constituting the preamble PRB, the predetermined period is 80% of the time corresponding to one known sequence. Further, for example, when signal detection through correlation detection requires the time corresponding to three known sequences constituting the preamble PRB, the predetermined period is 2.5 times the time corresponding to one known sequence.

When the second determination signal is input in the period during which the gate signal is output, that is, the gate period described above, the gate unit 204 outputs, to the packet detection unit 109, a power detection signal including a power detection result indicating that the reception SNR, that is, the reception intensity of the signal transmitted from the device with which the receiving device 100 communicates is strong (corresponding to "CASE OF (c)" in FIG. 7).

In FIG. 6B, for (a) which indicates a power value when a signal reception intensity is weak, the first determination signal is output at a time point t1 at which the computed power value of the signal exceeds the first power threshold value. However, the computed power value of the signal may not exceed the first power threshold value depending on the signal reception intensity (not illustrated in FIG. 7).

For (b) which indicates a power value when a signal reception intensity is medium, the first determination signal is output at the time point t1 at which the computed power value of the signal exceeds the first power threshold value, and the computed power value of the signal exceeds the second power threshold value at a time point t2'. Because the time before the time point t2' exceeds the time from the time point tgs to the time point tge during which the gate signal is output, the second determination signal is not output (corresponding to "CASE OF (b)" in FIG. 7).

For (c) which indicates a power value when a signal reception intensity is strong, the first determination signal is output at the time point t1 at which the computed power value of the signal exceeds the first power threshold value, and the computed power value of the signal exceeds the second power threshold value at a time point t2. Because the time point t2 does not exceed the time from the time point tgs to the time point tge during which the gate signal is output, the second determination signal is output (corresponding to "CASE OF (c)" in FIG. 7).

Although a timing at which the first determination signal is output changes slightly in response to a signal reception intensity, the power values indicated in (a) to (c), in which signal reception intensities are different, exceed the first power threshold value at the same time point for simplicity of description.

In FIG. 7, when a signal reception intensity is weak ((a) which indicates a power value when a signal reception intensity is weak in FIG. 6B), the computed power value of the signal does not exceed the second power threshold value, and therefore the second determination signal is not output and the power detection signal is not generated (not illustrated in FIG. 7).

When a signal reception intensity is medium (see "CASE OF (b)" in FIG. 7), the timing at which the computed power value of the signal exceeds the second power threshold value is not in the period from the time point t1 (=time point tgs), at which the computed power value of the signal exceeds the first power threshold value, to the time point tge, and therefore the power detection signal is not generated.

On the other hand, when a signal reception intensity is strong (see "CASE OF (c)" in FIG. 7), the timing at which the computed power value of the signal exceeds the second power threshold value is in the period from the time point t1 (=time point tgs), at which the computed power value of the signal exceeds the first power threshold value, to the time point tge, and therefore the power detection signal is generated.

Thus, when the reception intensity of the signal received by the receiving device 100 is strong, the power detection unit 108 can output, to the packet detection unit 109, a power detection signal including a power detection result indicating that the reception intensity of the signal transmitted from the device with which the receiving device 100 communicates is strong. When the signal reception intensity is not strong (medium or weak), a power detection signal is not output to the packet detection unit 109.

When a power value exceeds the second power threshold value and then falls below the second power threshold value within the gate period, a power detection signal is generated, but the time for making a search in a wide gain range (see Tables 1 and 2) is secured, and therefore reception is possible.

Figure 8:
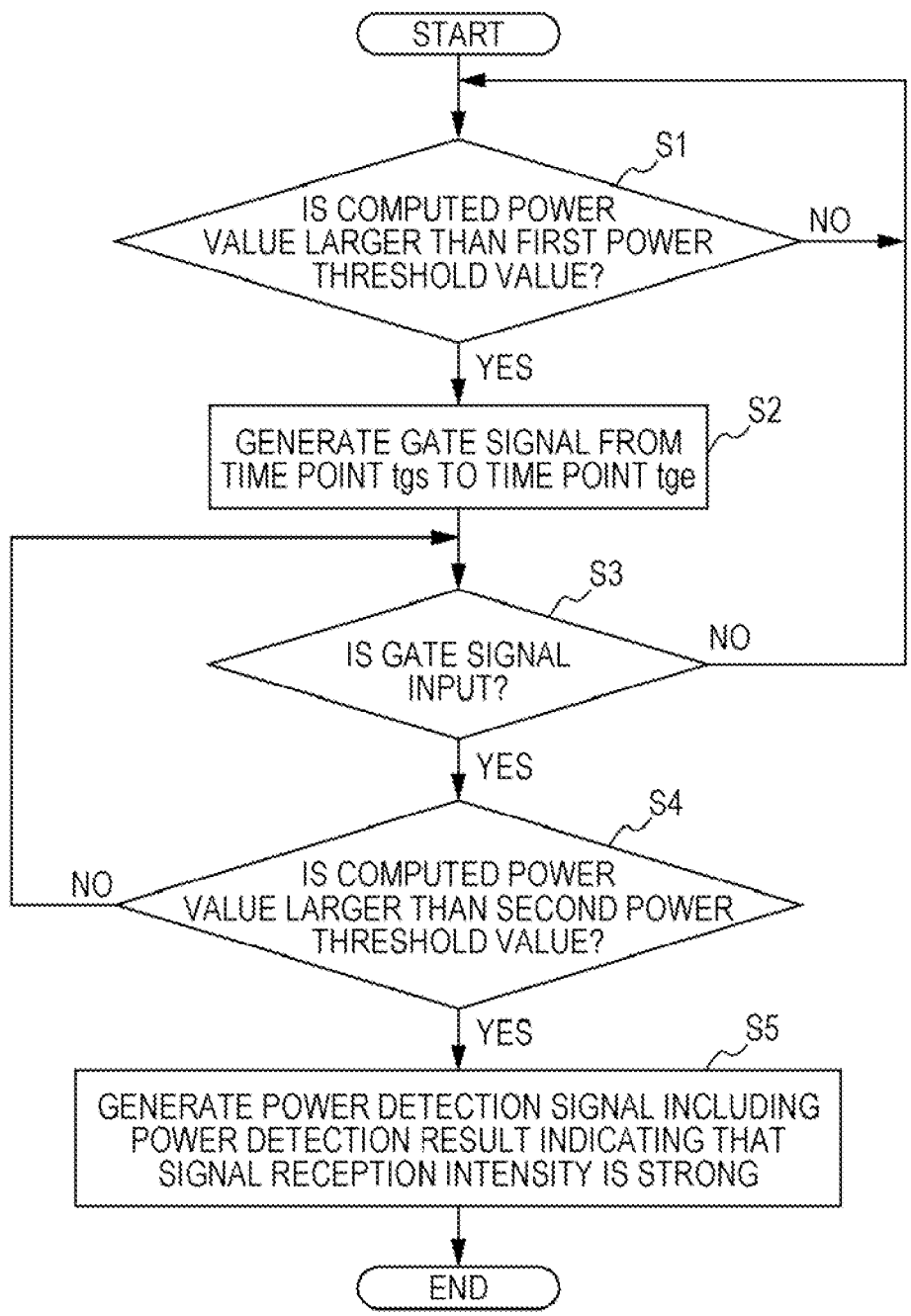
FIG. 8 is a flowchart illustrating an example of an operating procedure for power detection in the power detection unit of the receiving device of the present embodiment.

The operation of power detection in the power detection unit 108 of the receiving device 100 of the present embodiment will next be described with reference to FIG. 8. FIG. 8 is a flowchart illustrating an example of an operating procedure for power detection in the power detection unit 108 of the receiving device 100 of the present embodiment.

In FIG. 8, the power detection unit 108 uses the power value first determination unit 201 to determine whether the computed power value computed by the power computation unit 107 exceeds the predetermined first power threshold value (S1). When the power detection unit 108 determines that the computed power value computed by the power computation unit 107 exceeds the predetermined first power threshold value (YES at S1), the power detection unit 108 uses the gate signal generation unit 203 to output a gate signal for the predetermine period (time from the time point tgs to the time point tge) (S2).

While the gate signal generation unit 203 outputs the gate signal (YES at S3), when the power detection unit 108 determines that the computed power value computed by the power computation unit 107 exceeds the predetermined second power threshold value (YES at S4), the power detection unit 108 outputs, to the packet detection unit 109, a power detection signal including a power detection result indicating that the reception intensity of the signal transmitted from the device with which the receiving device 100 communicates is strong (S5). (Gain search range setting in the gain search range setting unit 111 of the receiving device 100)

Figure 9:
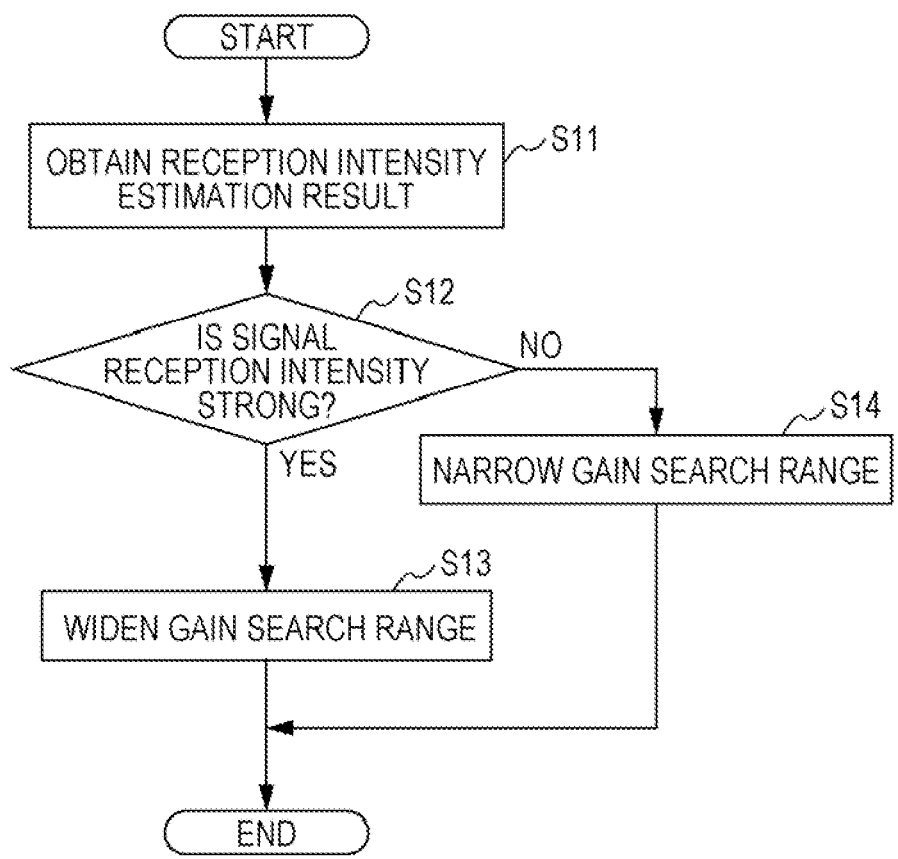
FIG. 9 is a flowchart illustrating an example of an operating procedure for gain search range setting in a gain search range setting unit of the receiving device of the present embodiment.

The detailed operation of gain search range setting in the gain search range setting unit 111 of the receiving device 100 of the present embodiment will next be described with reference to FIG. 9. FIG. 9 is a flowchart illustrating an example of an operating procedure for gain search range setting in the gain search range setting unit 111 of the receiving device 100 of the present embodiment.

In FIG. 9, the gain search range setting unit 111 obtains a reception intensity estimation result output from the packet detection unit 109 (S11). The gain search range setting unit 111 determines whether the reception intensity indicated in the reception intensity estimation result output from the packet detection unit 109 is strong (S12).

When the gain search range setting unit 111 determines that the reception intensity indicated in the reception intensity estimation result output from the packet detection unit 109 is strong (YES at S12), the gain search range setting unit 111 widens a gain search range for AGC processing (S13). For example, the gain search range setting unit 111 widens the gain search range by adjusting a control range of a total gain in the gain decision unit 112 to be the maximum range. The maximum range of the control range of a total gain G is, for example, a range of [Gmin, Gmax], where Gmin is the minimum value of a total gain that is the sum of a gain for the low noise amplifier 101 and a gain for the variable gain amplifier 103, and Gmax is the maximum value of the total gain.

That is, when the power value of the received signal is large enough to exceed the second power threshold value, the reception SNR of the received signal is large and the power rises quickly. Therefore, the timing at which the signal is detected through power detection is earlier than the timing at which the signal is detected through correlation detection.

Therefore, when the timing at which the signal is detected through power detection is earlier than the timing at which the signal is detected through correlation detection, the gain search range setting unit 111 can estimate that the reception intensity of the signal received by the receiving device 100 is strong. Because it is necessary to significantly decrease the total gain from the current setting, the gain search range setting unit 111 widens the gain search range of the total gain for AGC processing.

On the other hand, when the gain search range setting unit 111 determines that the reception intensity indicated in the reception intensity estimation result output from the packet detection unit 109 is not strong (NO at S12), the gain search range setting unit 111 narrows the gain search range for AGC processing such that the gain search range becomes a range in which the total gain value is increased (S14). For example, the range in which the total gain value is increased is a range of

[Rn×Gmax, Gmax], where Rn is a restriction rate of the control range of the total gain (for example, a value of about 0.3).

That is, when the power value of the received signal does not exceed the first power threshold value or the second power threshold value, the reception SNR of the received signal is small. It may be considered that the signal is detected, not through power detection but through correlation detection.

Therefore, the gain search range setting unit 111 can estimate that the reception intensity of the signal received by the receiving device 100 is not strong (medium or weak). Because it is not necessary to significantly decrease the total gain from the current setting, the gain search range setting unit 111 narrows the gain search range of the total gain for AGC processing.

Accordingly, the convergence time of the AGC processing in the gain decision unit 112 is short, and further, the gain decision unit 112 can reduce the convergence time of the AGC processing even though the time of signal detection through correlation detection corresponding to the predetermined preamble PRB is long. That is, it is possible to suppress a delay in the start of demodulation in the demodulation unit 113.

As described above, the receiving device 100 can determine whether the signal is detected through power detection or through correlation detection in the packet detection unit 109, and can set the gain search range of the total gain for AGC processing in accordance with the signal detection method by which the signal is detected first.

The power detection unit of the receiving device 100 of the present embodiment is not limited to the configuration of the power detection unit 108 illustrated in FIG. 5. Variations of the power detection unit will now be described with reference to the drawings.

(Detailed Configuration and Operation of a Power Detection Unit 108a of a First Variation)

Figure 10A:
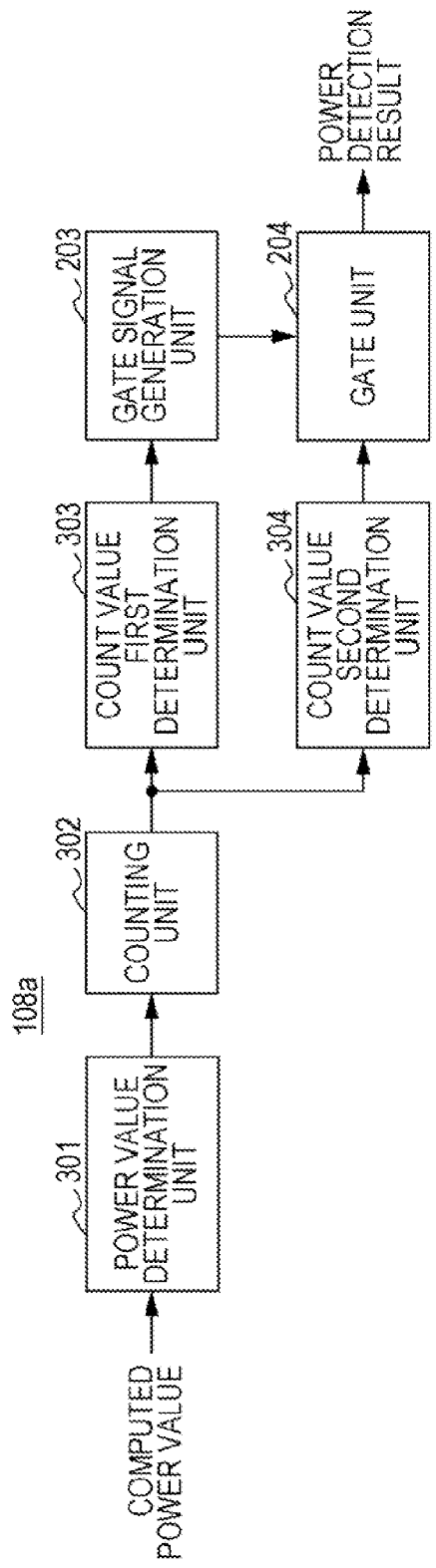
FIG. 10A is a block diagram illustrating in detail an internal configuration of a power detection unit of a first variation.
Figure 10B:
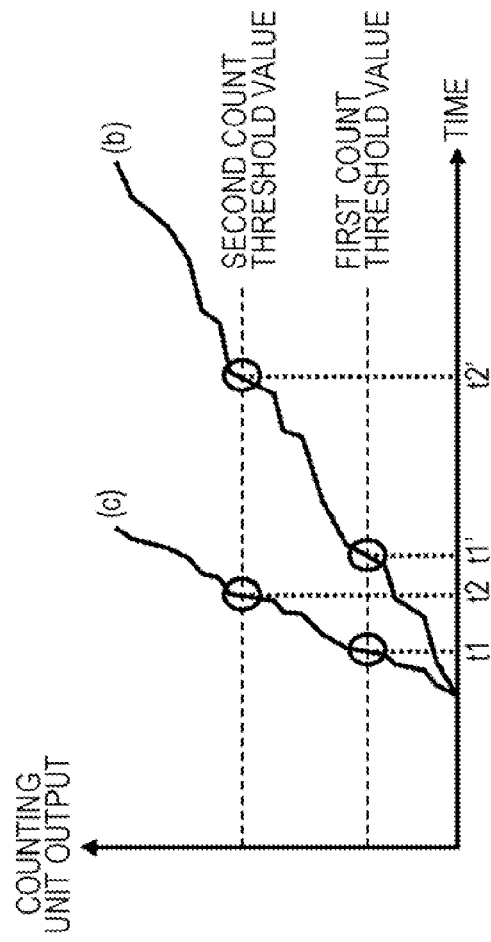
FIG. 10B illustrates an example of a relationship of counting unit outputs when signal reception intensities are strong and medium.

The detailed configuration and operation of a power detection unit 108a of a first variation will be described with reference to FIGS. 10A and 10B. FIG. 10A is a block diagram illustrating in detail an internal configuration of the power detection unit 108a of the first variation. FIG. 10B illustrates an example of a relationship of counting unit outputs when signal reception intensities are strong and medium.

The power detection unit 108a illustrated in FIG. 10A has a power value determination unit 301, a counting unit 302, a count value first determination unit 303, a count value second determination unit 304, the gate signal generation unit 203, and the gate unit 204. In the descriptions of the units of the power detection unit 108a illustrated in FIG. 10A, the descriptions about the same details as the units of the power detection unit 108 illustrated in FIG. 5 are omitted or simplified, and different details are described.

The power value determination unit 301 makes a comparison between the computed power value of the signal computed by the power computation unit 107 and a predetermined power determination threshold value, and outputs a result of the comparison between the computed power value of the signal and the power determination threshold value to the counting unit 302. The power determination threshold value is, for example, a predetermined percentage of a signal power value for maximizing an output amplitude of the analog-digital conversion unit 104, and this percentage is larger than the standby power target value (for example, 50%).

Based on the output from the power value determination unit 301, the counting unit 302 counts states in which the computed power value of the signal computed by the power computation unit 107 exceeds the power determination threshold value. That is, the counting unit 302 increments the count value by 1 at predetermined intervals while the signal exceeds the threshold value. Then, the counting unit 302 outputs the result (count value) to the count value first determination unit 303 and the count value second determination unit 304.

When the computed power value of the signal computed by the power computation unit 107 is less than a specific value continuously for a predetermined period, the counting unit 302 resets the count value to 0 (zero). When the reception intensity of the signal received by the receiving device 100 is medium, the computed power value may or may not exceed the second power threshold value illustrated in FIG. 6B, and therefore the count frequency of the count value in the counting unit 302 is lowered.

The count value first determination unit 303 makes a comparison between the count value output from the counting unit 302 and a predetermined first count threshold value. When the count value output from the counting unit 302 exceeds the first count threshold value, the count value first determination unit 303 outputs a first determination signal to the gate signal generation unit 203. The first count threshold value is a predetermined value corresponding to the first power threshold value used by the power value first determination unit 201.

The count value second determination unit 304 makes a comparison between the count value output from the counting unit 302 and a predetermined second count threshold value. When the count value output from the counting unit 302 exceeds the second count threshold value, the count value second determination unit 304 outputs a second determination signal to the gate signal generation unit 203. The second count threshold value is a predetermined value corresponding to the second power threshold value used by the power value second determination unit 202.

In FIG. 10B, for (a) which indicates a power value when a signal reception intensity is weak, because the power value is less than the power determination threshold value in the power value determination unit 301, the first determination signal and the second determination signal are not output. Therefore, the power value is not illustrated in FIG. 10B, and the description of the power value is omitted.

For (b) which indicates a power value when a signal reception intensity is medium, the first determination signal is output at a time point t1' at which the count value corresponding to the computed power value of the signal exceeds the first count threshold value, and the count value corresponding to the computed power value of the signal exceeds the second count threshold value at the time point t2'. Because the time point t2' exceeds the time from the time point tgs to the time point tge during which the gate signal is output as illustrated in FIG. 7, the second determination signal is not output.

For (c) which indicates a power value when a signal reception intensity is strong, the first determination signal is output at the time point t1 at which the count value corresponding to the computed power value of the signal exceeds the first count threshold value, and the count value corresponding to the computed power value of the signal exceeds the second count threshold value at the time point t2. Because the time point t2 does not exceed the time from the time point tgs to the time point tge during which the gate signal is output as illustrated in FIG. 7, the second determination signal is output.

Accordingly, even with the use of the configuration of the power detection unit 108a illustrated in FIG. 10A, as in the power detection unit 108 illustrated in FIG. 5, when the reception intensity of the signal received by the receiving device 100 is strong, the power detection unit 108a can output, to the packet detection unit 109, a power detection signal including a power detection result indicating that the reception intensity of the signal transmitted from the device with which the receiving device 100 communicates is strong. When the signal reception intensity is not strong (medium or weak), a power detection signal is not output to the packet detection unit 109.

(Detailed Configuration and Operation of a Power Detection Unit 108b of a Second Variation)

Figure 11:
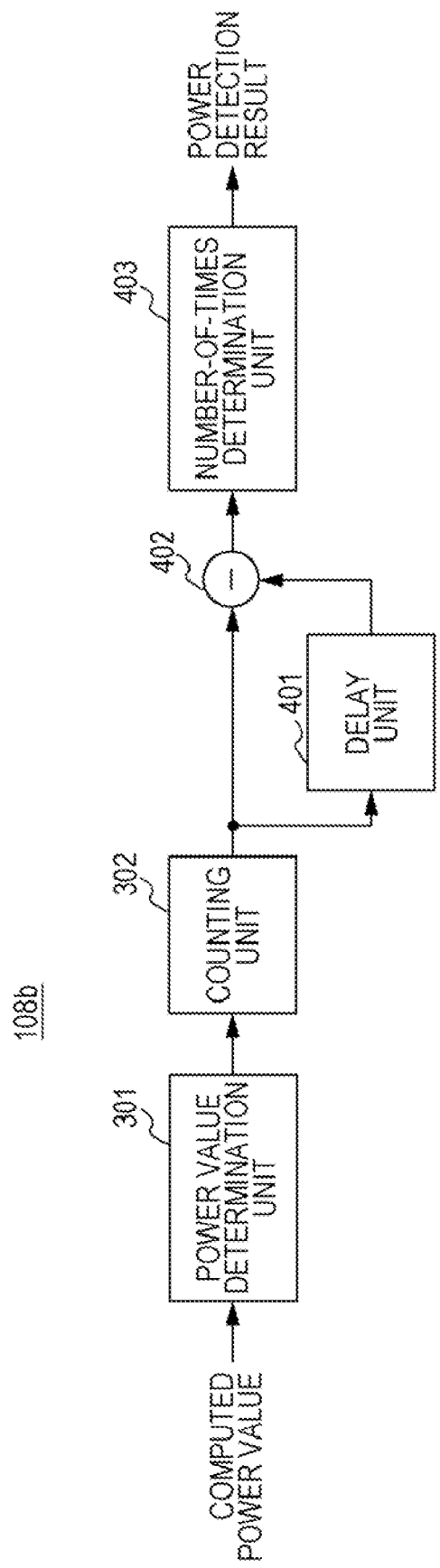
FIG. 11 is a block diagram illustrating in detail an internal configuration of a power detection unit of a second variation.

The detailed configuration and operation of a power detection unit 108b of a second variation will be described with reference to FIG. 11. FIG. 11 is a block diagram illustrating in detail an internal configuration of the power detection unit 108b of the second variation.

The power detection unit 108b illustrated in FIG. 11 has the power value determination unit 301, the counting unit 302, a delay unit 401, a subtraction unit 402, and a number-of-times determination unit 403. In the descriptions of the units of the power detection unit 108b illustrated in FIG. 11, the descriptions about the same details as the units of the power detection unit 108a illustrated in FIG. 10A are omitted or simplified, and different details are described.

Based on the output from the power value determination unit 301, the counting unit 302 counts states in which the computed power value of the signal computed by the power computation unit 107 exceeds the power determination threshold value. That is, the counting unit 302 increments the count value by 1 at predetermined intervals while the signal exceeds the threshold value. Then, the counting unit 302 outputs the result (count value) to the delay unit 401 and the subtraction unit 402. That is, as in FIG. 10B, the counting unit outputs increase with respect to an increase in time.

In the configuration with the count value first determination unit 303, the count value second determination unit 304, the gate signal generation unit 203, and the gate unit 204, the power detection unit 108a illustrated in FIG. 10A provides an equivalent for a determination of whether the reception intensity of the signal received by the receiving device 100 is strong, in response to an increment of the output (count value) from the counting unit 302 in a predetermined period, that is, an inclination with respect to time.

In contrast to this, the power detection unit 108b illustrated in FIG. 11 uses the delay unit 401 to delay the output (count value) from the counting unit 302 for a predetermined period. The delay unit 401 delays the output (count value) from the counting unit 302 for the predetermined period, and outputs the value to the subtraction unit 402.

The description will be given with reference to FIG. 10B. When a delay in the predetermined period is t2−t1, the value input from the counting unit 302 to the subtraction unit 402 is the count at the time point t2, and the value input from the delay unit 401 to the subtraction unit 402 is the count value at the time point t1.

The subtraction unit 402 performs a subtraction between the output (count value) from the counting unit 302 and the output (count value) from the counting unit 302 that is delayed by the delay unit 401, and outputs a subtraction result to the number-of-times determination unit 403. Accordingly, the subtraction unit 402 can obtain an increment of the output (count value) from the counting unit 302 in the predetermined time. That is, when a delay in the predetermined period is t2−t1, the increment is a value obtained by subtracting the count value at the time point t1 from the count at the time point t2.

The number-of-times determination unit 403 makes a comparison between the output from the subtraction unit 402 and a predetermined number-of-times threshold value. When the output from the subtraction unit 402 exceeds the number-of-times threshold value, the number-of-times determination unit 403 outputs, to the packet detection unit 109, a power detection signal including a power detection result indicating that the reception intensity of the signal transmitted from the device with which the receiving device 100 communicates is strong.

Accordingly, even with the use of the configuration of the power detection unit 108b illustrated in FIG. 11, as in the power detection unit 108 illustrated in FIG. 5, when the reception intensity of the signal received by the receiving device 100 is strong, the power detection unit 108b can output, to the packet detection unit 109, a power detection signal including a power detection result indicating that the reception intensity of the signal transmitted from the device with which the receiving device 100 communicates is strong. When the signal reception intensity is not strong (medium or weak), a power detection signal is not output to the packet detection unit 109.

(Detailed Configuration and Operation of a Power Detection Unit 108c of a Third Variation)

The detailed configuration and operation of a power detection unit 108c of a third variation will be described with reference to FIGS. 12A and 12B. FIG. 12A is a block diagram illustrating in detail an internal configuration of the power detection unit 108c of the third variation. FIG. 12B illustrates an example of a relationship of integration unit outputs when signal reception intensities are strong and medium.

The power detection unit 108c illustrated in FIG. 12A has a power value determination unit 501, a power integration unit 502, an integration value first determination unit 503, an integration value second determination unit 504, the gate signal generation unit 203, and the gate unit 204. In the descriptions of the units of the power detection unit 108c illustrated in FIG. 12A, the descriptions about the same details as the units of the power detection unit 108 illustrated in FIG. 5 are omitted or simplified, and different details are described.

The power value determination unit 501 makes a comparison between the computed power value of the signal computed by the power computation unit 107 and a predetermined power integration threshold value. When the computed power value of the signal exceeds the power integration threshold value, the power value determination unit 501 outputs an integration start signal to the power integration unit 502. The power integration threshold value is, for example, a predetermined percentage of a signal power value for maximizing an output amplitude of the analog-digital conversion unit 104, and this percentage is larger than the standby power target value (for example, 50%).

Based on the integration start signal output from the power value determination unit 501, the power integration unit 502 starts time integration of the computed power value of the signal computed by the power computation unit 107. When the reception intensity of the signal received by the receiving device 100 is strong, a power integration value increases more quickly than when the reception intensity of the signal is medium. The power integration unit 502 outputs an integration value of the computed power value of the signal computed by the power computation unit 107 to the integration value first determination unit 503 and the integration value second determination unit 504.

The integration value first determination unit 503 makes a comparison between the integration value output from the power integration unit 502 and a predetermined first integration threshold value. When the integration value output from the power integration unit 502 exceeds the first integration threshold value, the integration value first determination unit 503 outputs a first determination signal to the gate signal generation unit 203. The first integration threshold value is a predetermined value corresponding to the first power threshold value used by the power value first determination unit 201.

The integration value second determination unit 504 makes a comparison between the integration value output from the power integration unit 502 and a predetermined second integration threshold value. When the integration value output from the power integration unit 502 exceeds the second integration threshold value, the integration value second determination unit 504 outputs a second determination signal to the gate signal generation unit 203. The second integration threshold value is a predetermined value corresponding to the second power threshold value used by the power value second determination unit 202.

In FIG. 12B, for (a) which indicates a power value when a signal reception intensity is weak (not illustrated), because the power value is less than the power determination threshold value in the power value determination unit 501, the first determination signal and the second determination signal are not output, and the description of the power value is omitted.

For (b) which indicates a power value when a signal reception intensity is medium, the first determination signal is output at the time point t1' at which the integration value corresponding to the computed power value of the signal exceeds the first integration threshold value, and the integration value corresponding to the computed power value of the signal exceeds the second integration threshold value at the time point t2'. Because the time point t2' exceeds the time from the time point tgs to the time point tge during which the gate signal is output, the second determination signal is not output.

For (c) which indicates a power value when a signal reception intensity is strong, the first determination signal is output at the time point t1 at which the integration value corresponding to the computed power value of the signal exceeds the first integration threshold value, and the integration value corresponding to the computed power value of the signal exceeds the second integration threshold value at the time point t2. Because the time point t2 does not exceed the time from the time point tgs to the time point tge during which the gate signal is output, the second determination signal is output.

Accordingly, even with the use of the configuration of the power detection unit 108c illustrated in FIG. 12A, as in the power detection unit 108 illustrated in FIG. 5, when the reception intensity of the signal received by the receiving device 100 is strong, the power detection unit 108c can output, to the packet detection unit 109, a power detection signal including a power detection result indicating that the reception intensity of the signal transmitted from the device with which the receiving device 100 communicates is strong. When the signal reception intensity is not strong (medium or weak), a power detection signal is not output to the packet detection unit 109.

Although various embodiments have been described above with reference to the drawings, it is obvious that the present disclosure is not limited to such examples. It is apparent that those skilled in the art would be able to conceive various examples of changes or modifications within the scope indicated in the claims, and it should be appreciated that these examples are also included in the technical scope of the present disclosure.

The present disclosure has been described above with an example in which the receiving device 100 is configured with, for example, hardware resources. However, part of the receiving device 100 may be configured with software that collaborates with the hardware resources.

The units (components) of the receiving device 100 of the present embodiment described above are typically implemented as large scale integration (LSI) chips, which are integrated circuits. An each individual component may be contained on a single LSI chip, or some or all components may be contained on a single LSI chip. The integrated circuit technique is LSI here, but may be referred to as integrated circuit (IC), system LSI, super LSI, or ultra LSI depending on a difference in a degree of integration.

The integrated circuit technique is not limited to LSI, and the components may be implemented using dedicated circuits or general-purpose processors. After the manufacture of LSI chips, field programmable gate arrays (FPGAs), or reconfigurable processors with which the connection and setting of circuit cells inside the LSI chips are reconfigurable may be used.

In addition, if an integrated circuit technology that replaces LSI emerges with the advance of the semiconductor technology or with the advent of another derivative technology, the units of the receiving device 100 may be integrated using that technology. There is a possibility of, for example, applying the biotechnology.

The present disclosure is useful as a receiving device that enhances the speed of convergence of AGC and suppresses degradation of the detection accuracy for a received signal, regardless of whether a device with which the receiving device communicates is changed or moved.

What is claimed is:

1. A reception apparatus comprising:
a gain controller which, in operation, adjusts a gain in the reception apparatus in accordance with information regarding a power of a signal received via a reception antenna;
a counter which, in operation, counts a number of times the power of the signal exceeds a first threshold value;
a delay unit which, in operation, holds a first count value at time t1 of the counter for a predetermined period;
a subtractor which, in operation, subtracts the first count value at time t1 outputted from the delay unit from a second count value at time t2 outputted from the counter;
a number-of-times determiner which, in operation, outputs a power detection signal indicating a strong electric field based on an output from the subtractor,
wherein the gain controller adjusts a search range of the gain in the reception apparatus based on the power detection signal.

2. The reception apparatus according to claim 1, wherein the number-of-times determiner, in operation, outputs the power detection signal indicating a strong electric field based on comparison between the output from the subtractor and a number-of-times threshold value.

3. The reception apparatus according to claim 1, further comprising:
a power detector which, in operation, detects the signal based on the information regarding the power of the signal; and
a correlation detector which, in operation, detects the signal based on a correlation between the signal and a defined sequence.

4. The reception apparatus according to claim 1, wherein the gain controller widens the search range of the gain, in a case where the number-of-times determiner outputs the power detection signal, and
the gain controller narrows the search range of the gain, in a case where the number-of-times determiner does not output the power detection signal.

5. The reception apparatus according to claim 2, wherein the number-of-times determiner, in operation, outputs the power detection signal indicating a strong electric field when the output from the subtractor exceeds the number-of-times threshold value.

6. A reception method comprising:
   i) adjusting a gain in a reception apparatus in accordance with information regarding a power of a signal received via a reception antenna;
   ii) counting a number of times the power of the signal exceeds a first threshold value;
   iii) holding a first count value at time t1 obtained in step ii) for a predetermined period;
   iv) subtracting the first count value at t1 obtained in step iii) from a second count value at time t2 obtained in step ii);
   v) outputting a power detection signal indicating a strong electric field based on a subtraction output obtained in step iv),
   wherein step i) adjusts a search range of the gain in the reception apparatus based on the power detection signal.

7. The reception method according to claim 6, wherein step v) outputs the power detection signal indicating a strong electric field based on comparison between the subtraction output obtained in step iv) and a number-of-times threshold value.

8. The reception method according to claim 6, further comprising:
   vi) detecting the signal based on the information regarding the power of the signal; and
   vii) detects the signal based on a correlation between the signal and a defined sequence.

9. The reception method according to claim 6, wherein
   step i) widens the search range of the gain, in a case where step v) outputs the power detection signal, and
   step i) narrows the search range of the gain, in a case where step v) does not output the power detection signal.

10. The reception method according to claim 7, wherein step v) outputs the power detection signal indicating a strong electric field when the subtraction output obtained in step iv) exceeds the number-of-times threshold value.

* * * * *